(12) United States Patent
Campbell et al.

(10) Patent No.: US 12,037,680 B2
(45) Date of Patent: Jul. 16, 2024

(54) METHOD OF PROCESSING A CMC AIRFOIL

(71) Applicant: RTX CORPORATION, Farmington, CT (US)

(72) Inventors: Christian X. Campbell, West Hartford, CT (US); David J. Wasserman, Hamden, CT (US); Ahmed Abdillahi Abdi, Oceanside, CA (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 18/466,924

(22) Filed: Sep. 14, 2023

(65) Prior Publication Data

US 2024/0167152 A1     May 23, 2024

Related U.S. Application Data

(62) Division of application No. 17/990,974, filed on Nov. 21, 2022, now Pat. No. 11,866,820.

(51) Int. Cl.
   *B23B 41/00*      (2006.01)
   *C23C 16/32*      (2006.01)
   *C23C 16/34*      (2006.01)

(52) U.S. Cl.
   CPC ............ *C23C 16/325* (2013.01); *B23B 41/00* (2013.01); *C23C 16/345* (2013.01); *B23B 2215/81* (2013.01); *B23B 2226/18* (2013.01); *B23B 2226/27* (2013.01)

(58) Field of Classification Search
   CPC ...... C23C 16/325; C23C 16/345; B23B 41/00; B23B 2215/81; B23B 2226/18; B23B 2226/27
   See application file for complete search history.

(56) References Cited

U.S. PATENT DOCUMENTS

| | | | |
|---|---|---|---|
| 10,815,801 B2 | 10/2020 | Watanabe | |
| 10,906,842 B2 | 2/2021 | Shi et al. | |
| 11,104,032 B2* | 8/2021 | White | B28B 3/02 |
| 11,286,792 B2 | 3/2022 | Razzell et al. | |
| 2006/0292005 A1 | 12/2006 | Pietraskiewicz et al. | |

OTHER PUBLICATIONS

1 European Search Report for European Patent Application No. 23211307.6 mailed Apr. 24, 2024.

* cited by examiner

*Primary Examiner* — Lee A Holly
(74) *Attorney, Agent, or Firm* — Carlson, Gaskey & Olds, P.C.

(57) ABSTRACT

A method for processing a CMC airfoil includes nesting an airfoil fiber preform in a cavity of a fixture that has first and second tool segments, closing the fixture by rotating a first tool segment about a hinge, the closing causing the tool segments to clamp on a tail portion of the fiber preform and thereby conform the tail portion to the fixture. While in the fixture, the fiber preform is then partially densified with an interface coating material to form a partially densified fiber preform. While still in the fixture, one or more cooling holes are drilled into the trailing edge of the partially densified fiber preform. After the drilling, the partially densified fiber preform is removed from the fixture and further densified with a ceramic matrix material to form a fully densified CMC airfoil.

8 Claims, 5 Drawing Sheets

METHOD OF PROCESSING A CMC AIRFOIL

BACKGROUND

A gas turbine engine typically includes a fan section, a compressor section, a combustor section and a turbine section. Air entering the compressor section is compressed and delivered into the combustion section where it is mixed with fuel and ignited to generate a high-pressure and temperature exhaust gas flow. The high-pressure and temperature exhaust gas flow expands through the turbine section to drive the compressor and the fan section. The compressor section may include low and high pressure compressors, and the turbine section may also include low and high pressure turbines.

Airfoils in the turbine section are typically formed of a superalloy and may include thermal barrier coatings to extend temperature capability and lifetime. Ceramic matrix composite ("CMC") materials are also being considered for airfoils. Among other attractive properties, CMCs have high temperature resistance. Despite this attribute, however, there are unique challenges to implementing CMCs in airfoils.

SUMMARY

A method for processing a CMC airfoil according to an example of the present disclosure includes providing an airfoil fiber preform that defines a leading edge, a trailing edge, and first and second sides that join the leading edge and the trailing edge, the trailing edge having a tail portion, providing a fixture that has first and second tool segments that define a cavity there between for holding the airfoil fiber preform, the cavity having a cavity leading edge, a cavity trailing edge, and first and second cavity sides joining the cavity leading edge and the cavity trailing edge, the first and second tool segments being couplable at a hinge located near the cavity leading edge, nesting the airfoil fiber preform in the cavity, closing the fixture by rotating the first tool segment about the hinge, the closing causing the first and second tool segments to clamp on the tail portion and thereby conform the tail portion to the cavity trailing edge of the fixture, while in the fixture, partially densifying the fiber preform with an interface coating material to form a partially densified fiber preform, while in the fixture, drilling one or more cooling holes into the trailing edge of the partially densified fiber preform, and, after the drilling, removing the partially densified fiber preform from the fixture and further densifying the partially densified fiber preform with a ceramic matrix material to form a fully densified CMC airfoil.

In a further embodiment of the foregoing embodiment, the first tool segment includes first and second datum features configured to position the fixture in a drilling machine for drilling the one or more cooling holes.

In a further embodiment of any of the foregoing embodiments, the partially densified fiber preform has a void volume of 40% to 50%.

A further embodiment of any of the foregoing embodiments further includes, after the drilling, removing the tail portion, thereby leaving a remainder of the trailing edge with the one or more cooling holes there through.

In a further embodiment of any of the foregoing embodiments, the second tool segment includes a ridge in the cavity trailing edge that concentrates pressure on the tail portion from the closing of the fixture.

In a further embodiment of any of the foregoing embodiments, after the closing, the first and second tool segments are secured together by applying a clamp near the cavity trailing edge.

In a further embodiment of any of the foregoing embodiments, the partially densifying of the fiber preform and the further densifying of the partially densified fiber preform are both conducted by vapor infiltration.

In a further embodiment of any of the foregoing embodiments, prior to the partially densifying of the fiber preform, the fiber preform is devoid of any ceramic matrix.

In a further embodiment of any of the foregoing embodiments, the fixture is graphite, and the partially densifying of the fiber preform and the further densifying of the partially densified fiber preform are both conducted by vapor infiltration.

In a further embodiment of any of the foregoing embodiments, the drilling includes at least one of mechanical drilling, laser drilling, ultrasonic drilling, or electron beam drilling.

In a further embodiment of any of the foregoing embodiments, the partially densified fiber preform has a void volume of 40% to 50%.

A fixture for forming a CMC airfoil according to an example of the present disclosure includes first and second tool segments that define an airfoil cavity there between for receiving an airfoil fiber preform, the cavity having a cavity leading edge, a cavity trailing edge, and first and second cavity sides joining the cavity leading edge and the cavity trailing edge, the first and second tool segments being couplable at a hinge located near the cavity leading edge, and the first tool segment including first and second datum features configured to position the fixture in a drilling machine for drilling one or more cooling holes.

In a further embodiment of any of the foregoing embodiments, the first datum feature includes a pin.

In a further embodiment of any of the foregoing embodiments, the second tool segment includes a ridge in the cavity trailing edge.

In a further embodiment of any of the foregoing embodiments, the first and second tool segments are graphite.

The present disclosure may include any one or more of the individual features disclosed above and/or below alone or in any combination thereof.

BRIEF DESCRIPTION OF THE DRAWINGS

The various features and advantages of the present disclosure will become apparent to those skilled in the art from the following detailed description. The drawings that accompany the detailed description can be briefly described as follows.

In this disclosure, like reference numerals designate like elements where appropriate and reference numerals with the addition of one-hundred or multiples thereof designate modified elements that are understood to incorporate the same features and benefits of the corresponding elements.

DETAILED DESCRIPTION

Hot section gas turbine engine articles rely on high precision features to achieve high performance Such features are often created via a post-fabrication machining processes. Machining these features requires precisely locating the article in space, for example in a six-point nest. The surfaces of metal-cast articles are generally sufficient for precise location. However, this process is more challenging for a CMC article that is formed from a fiber preform. For instance, fiber preforms generally have low dimensional tolerance and high surface roughness, resulting in variability when locating the article for machining. Moreover, depending on factors such as a part position in the reactor, ceramic matrix buildup can vary from part-to-part. One particular region of interest is at the trailing edge region of an airfoil, where walls are thin and precision is required for achieving operational and durability goals. In this regard, the following examples describe a method for processing a CMC airfoil to form one or more cooling holes in the trailing edge region with a high level of precision.

Figure 1:
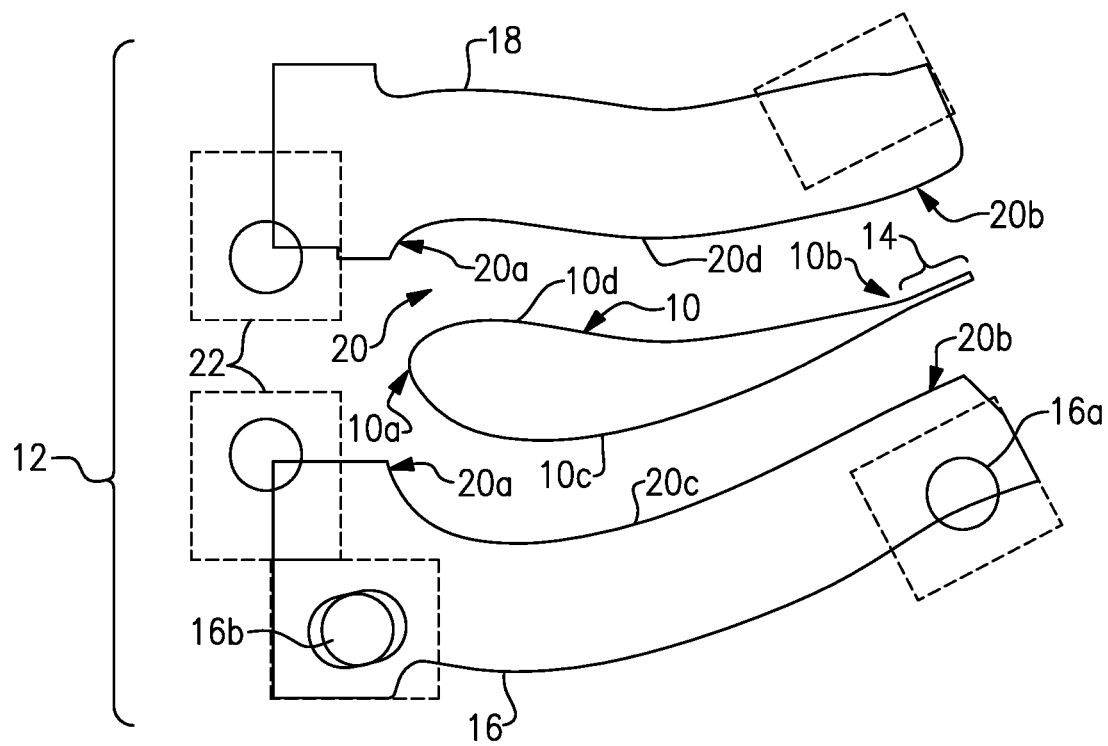
FIG. 1 illustrates an airfoil fiber preform and a fixture for holding the preform during various stages of processing.

FIG. 1 illustrates an airfoil fiber preform 10 and a fixture 12 for holding the preform 10 during various stages of processing. The preform 10 is a ceramic fiber structure that has been formed into the desired geometry of the end-use airfoil article, such as a vane or a blade. Ceramic fibers are formed of bundles of filaments and may include, but are not limited to, silicon carbide (SiC) fibers or silicon nitride (Si3N4) fibers. For instance, the preform 10 may include multiple fiber layers or plies that are laid-up to form the desired geometry. In some instances, the fiber layers or plies are laid-up around one or more mandrels, which may remain in the preform 10 through a portion of the processing and then be removed later on to leave one or more internal cavities in the end-use airfoil article. In general, however, the perform 10 is initially devoid of any ceramic matrix material.

The preform 10 defines a leading edge 10a, a trailing edge 10b, and first and second sides 10c/10d that join the leading edge 10a and the trailing edge 10b. As shown, the first side 10c will be the suction side of the end-use airfoil article, and the second side 10d will be the pressure side. The trailing edge 10b has a tail portion 14 that extends past the location where the trailing edge is on the final article. The tail portion 14 is sacrificial, as it is not part of the final end-use article and will be removed later in the processing. The terminology "first" and "second" as used herein is to differentiate that there are two architecturally distinct components or features. It is to be further understood that the terms "first" and "second" are interchangeable in the embodiments herein in that a first component or feature could alternatively be termed as the second component or feature, and vice versa.

The fixture 12 is comprised of first and second tool segments 16/18 that define a cavity 20 there between for holding the preform 10. The tool segments 16/18 are formed of graphite, for high temperature resistance and inertness relative to the preform 10 and the coating that will be subsequently applied to the preform 10. The cavity 20 is generally complementary in geometry to the geometry of the preform 10 and includes a cavity leading edge 20a, a cavity trailing edge 20b, and first and second cavity sides 20c/20d that join the cavity leading edge 20a and the cavity trailing edge 20b. The tool segments 16/18 are separate pieces but are couplable at a hinge 22 located at the forward end of the fixture 12 near the cavity leading edge 20a.

With the tool segments initially 16/18 separated, the preform 10 is nested into the fixture 12 by placing the preform 10 into the portion of the cavity 20 in the first tool segment 16. The geometry of the preform 10 is generally complementary to that of the cavity 20 such that the preform 10 fits snugly in the cavity 20 in the first tool segment 16. The cavity 20 may be very slightly oversized in order to leave a gap of up to approximately 0.005 inches between the leading edge 10a and the cavity leading edge 20a. Such a gap serves to provide clearance for the later rotation of the tool segments 16/18.

Figure 2:
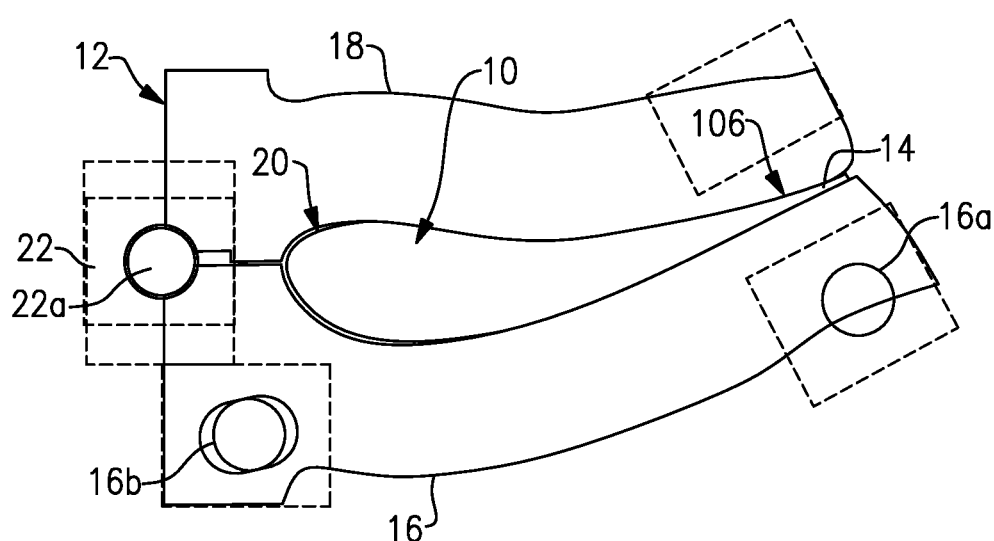
FIG. 2 illustrates the fixture in a closed position around the fiber preform.

Referring to FIG. 2, the second tool segment 18 is then moved into proximity of the first tool segment such that the portion of the cavity 20 in the second tool segment 18 is received onto, or at least into close proximity to, the preform 10. Each of the tool segments 16/18 includes a portion of the hinge 22 such that when the segments 16/18 are brought together the hinge portions align and permit insertion of a hinge pin 22a. The hinge pin 22a rotatably couples the tool segments 16/18 together.

The fixture 12 is then closed around the preform 10 by rotating the second tool segment 18 about the hinge pin 22a relative to the first tool segment 16. The closing causes the tool segments 16/18 to clamp on the tail portion 14 of the trailing edge 10b of the preform 10. The hinge 22 is located opposite the tail portion 14 to provide a mechanical advantage for applying clamping force to the tail portion 14. Although the preform 10 is relatively stiff, the tail portion 14 is thin and somewhat pliable. The clamping force urges the tail portion 14 against the cavity wall of the first tool segment 16. This causes the tail portion 14 to elastically deform and substantially conform to the wall of the segment 16 in the cavity trailing edge 20b, thereby providing a precise location of the trailing edge 10b of the preform 10 relative to the fixture 12. If desired, techniques such as X-Ray Micro Computed Tomography (xCT) or other nondestructive evaluation can be used to inspect the positioning between the tail portion 14 and the cavity wall.

Figure 3:
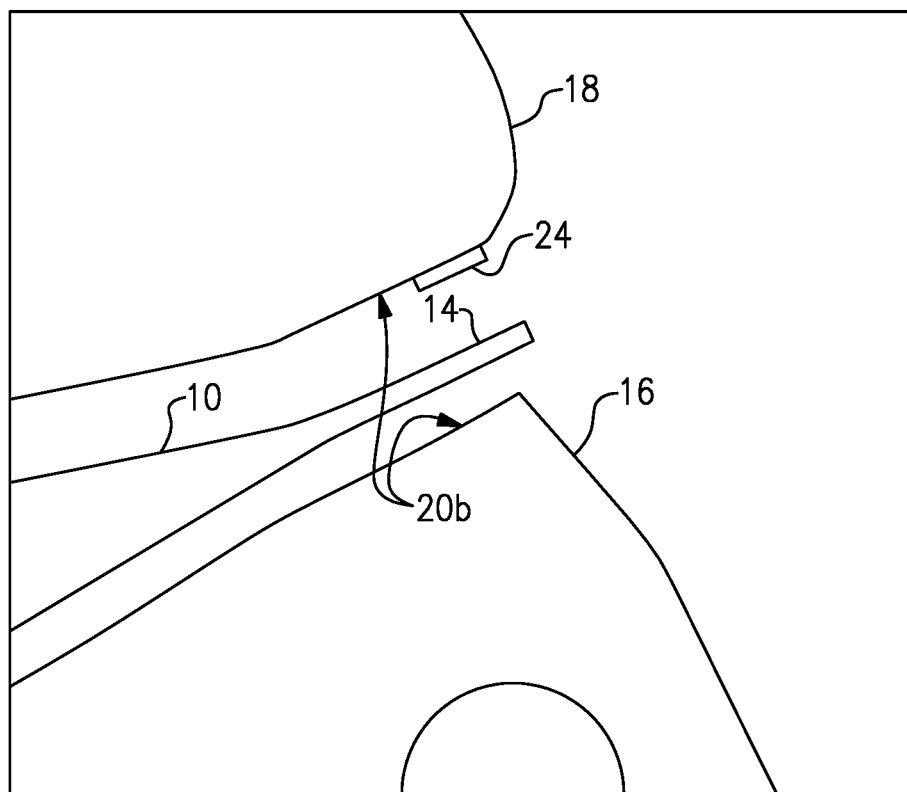
FIG. 3 illustrates a ridge in the fixture for concentrating pressure on a tail portion of the fiber preform.

Optionally, as depicted in FIG. 3, the second tool segment 18 may include a ridge 24 in the cavity trailing edge 20b. The ridge 24 is an elongated elevated band that extends in the cavity 20 and aligns with the tail portion 14 such that when the fixture is closed the ridge 24 contacts the tail portion 14. The ridge 24 serves to concentrate pressure on the tail portion 14 during closing of the fixture 12. The concentration of pressure further urges the tail portion 14 to conform against the cavity wall of the first tool segment 16. For example, the location of the ridge 24 is at a location along the trailing edge 10b that is deemed critical for high precision. The ridge 24 may have a height of approximately 0.001 inches to 0.005 inches. Such a height avoids imprinting a "step" in the trailing edge 10b of the preform 10. Thus, the pressure is concentrated, but without introducing an abrupt discontinuity in the smooth profile of the trailing edge 10b. Alternatively, a larger height that is above 0.005 inches up to about 0.01 inches may be used if the ridge 24 is entirely within the sacrificial tail portion 14, which will be removed in subsequent processing. The larger height facilitates further concentration of pressure on the tail portion 14, which may be desirable where the fibers in the trailing edge 10b are particularly stiff and resistant to conformation.

The first tool segment 16 also includes first and second datum features 16a/16b that will be used later on to precisely position the fixture 12, and thus the preform 10, in a drilling machine. For example, the first datum feature is a pin disposed in a pin hole of a boss on the segment 16, and the second datum feature 18 is a pin disposed in a pin slot of a boss at the other end of the segment 16. The pin/pin hole control translational degrees of freedom (in the x-axis and y-axis in the plane of the figure), and the pin/pin slot control rotational degree of freedom. The datum features 16a/16b will be later on used during a drilling operation to position the fixture 12 in a drilling machine for drilling the one or more cooling holes in the partially densified preform 10. As will be appreciated, there are other types of datum features, such as but not limited to, spherical datums that may alternatively be used.

Figure 4:
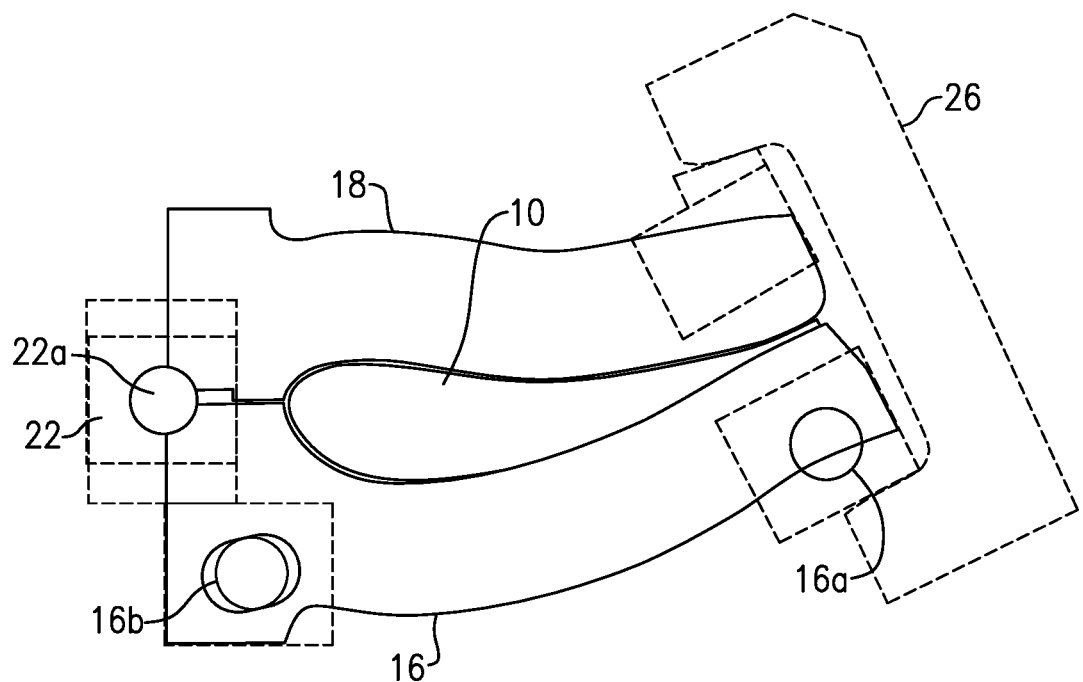
FIG. 4 illustrates a clamp on the fixture to secure the segments of the fixture together and maintain the position of the fiber preform relative to the fixture.

After the closing of the fixture 12, the fixture 12 is locked in order to maintain pressure on the tail portion 14 and thus maintain the location of the tail portion 14 relative to the fixture 12. For example, as shown in FIG. 4, a clamp 26 is applied near the cavity trailing edge 20b on the aft end of the fixture 12 to hold the segments 16/18 in place. The preform 10 is relatively stiff and there may be a substantial elastic spring-back force when the pressure is applied. In this regard, the clamp 26 should be of robust construction and strength in order to hold the segments 16/18 together. In some examples, the clamp 26 may be made of graphite, however, for greater strength it can alternatively be made of carbon/carbon composite or ceramic matrix composite.

Figure 5:
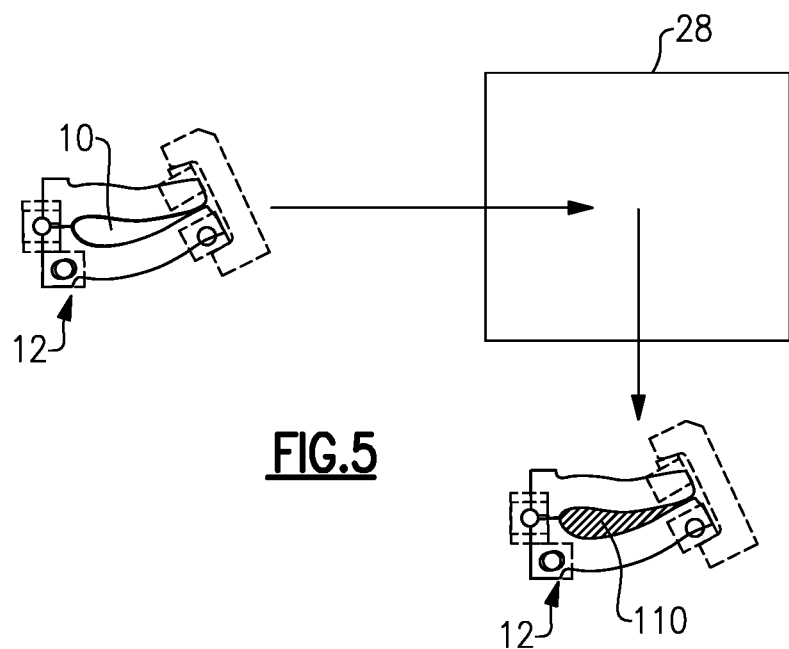
FIG. 5 illustrates insertion of the fixture and fiber preform into a reactor for application of interface coating materials.

As shown in FIG. 5, once mounted in the fixture 12, the fixture 12 and preform 10 are then inserted into a reactor 28 for deposition of one or more interface coating materials. The interface coating material may be, but is not limited to, boron nitride (BN), carbon, or silicon carbide (SiC). For example, the resultant interface coating on the fibers of the preform 10 may include layers of two or more different interface coating materials. As is known, interface coatings provide a relatively weak interface between the matrix and the fibers. The preform 10 is partially densified in the reactor 28 to form a partially densified fiber preform 110. As an example, the interface coating process conducted in the reactor 28 is, but is not limited to, chemical vapor infiltration. The interface coating process is stopped prior to full densification of the partially densified fiber preform 110. For instance, the partially densified fiber preform 110 has a void volume of 40% to 50% As will be described below, partial densification facilitates the later drilling operation.

Figure 6:
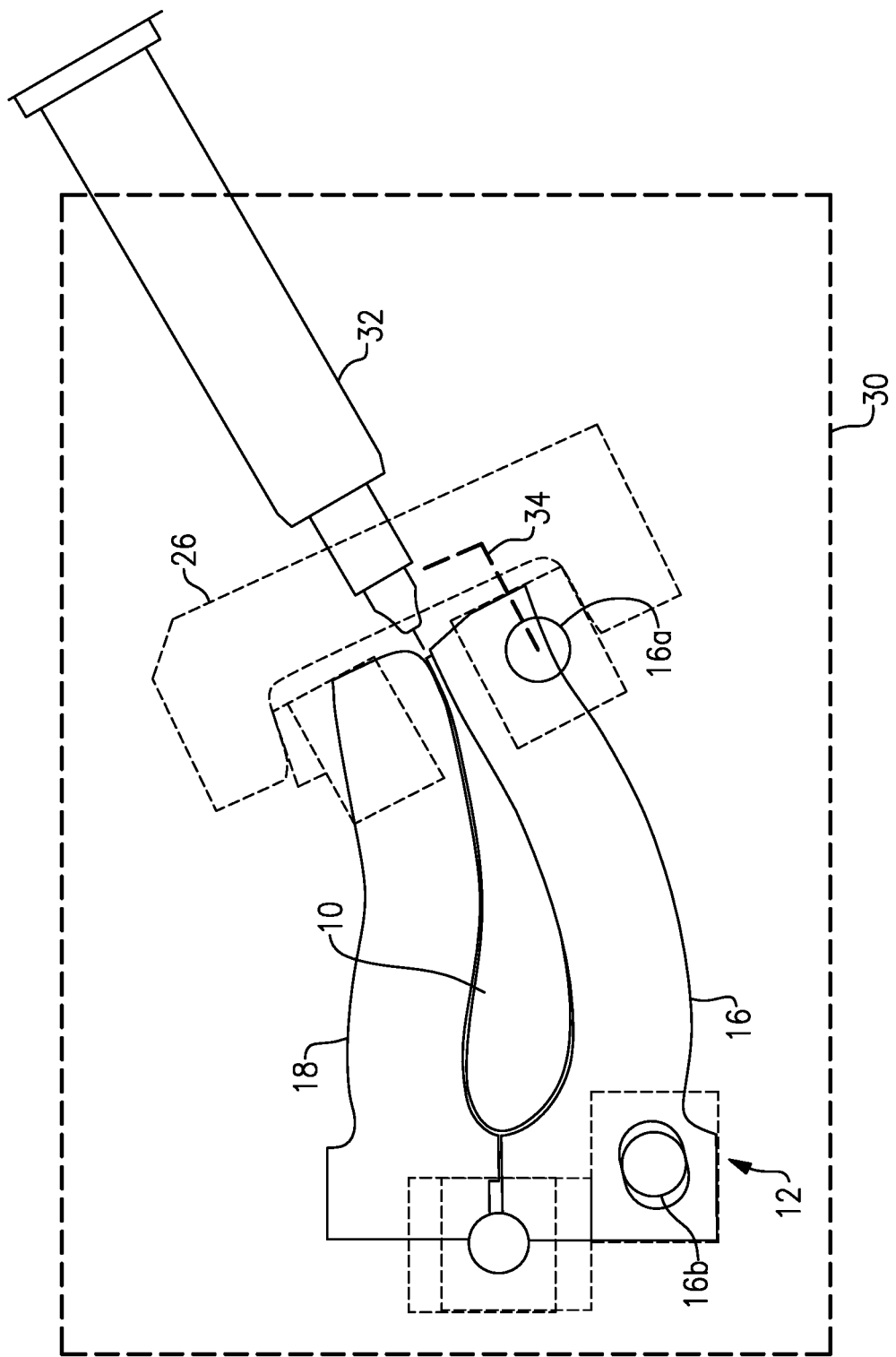
FIG. 6 illustrates the fixture and partially densified fiber preform in a drilling machine for drilling a cooling hole in the article.

As shown in FIG. 6, while still in the fixture 12 the partially densified fiber preform 110 is removed from the reactor 28 and then mounted in a drilling machine 30. The drilling machine 30 may be of known construction and may include a holder (not shown), a drill head 32, and an electronic control module (not shown). The holder serves to secure the component fixture 12 in a known position with reference to the datum features 16a/16b so that the drill head 32 can be precisely positioned for the drilling operation. The holder may include one or more clamps, fasteners, clips, fixtures, adhesive, or the like that are used to mount (i.e., secure) the fixture 12. In the case of laser drilling (e.g., water-guided laser drilling), the drill head 32 may include a nozzle that is positioned relative to the fixture 12 in a drilling arrangement, represented at 34. The drilling arrangement 34 refers to the setup of the relative positioning of one or more of the datum features 16a/16b of the fixture 12 and the drill head 32 in the drilling machine 30. In this manner, the position of the drill head 32 is precisely controlled relative to the surface of the cavity trailing edge 20b in the first tool segment 16. Such a positioning is desired for precision location of the cooling hole that is to be drilled relative to the suction side surface of the airfoil. As will be appreciated, the position of the drill head 32 may be precisely controlled relative to another surface of the cavity 20 if there are other desirable precision locations for a particular design implementation.

The partial densification of the fiber preform 110 facilitates the drilling, as there is less material to remove in comparison to a fully densified article. Accordingly, drilling the partially densified fiber preform 110 rather than drilling a fully densified article is expected to significantly reduce process times. Additionally, although laser drilling may be used, the low density may alternatively permit machining, such as abrasive machining, mechanical drilling, ultrasonic machining, or electron beam drilling.

Figure 7:
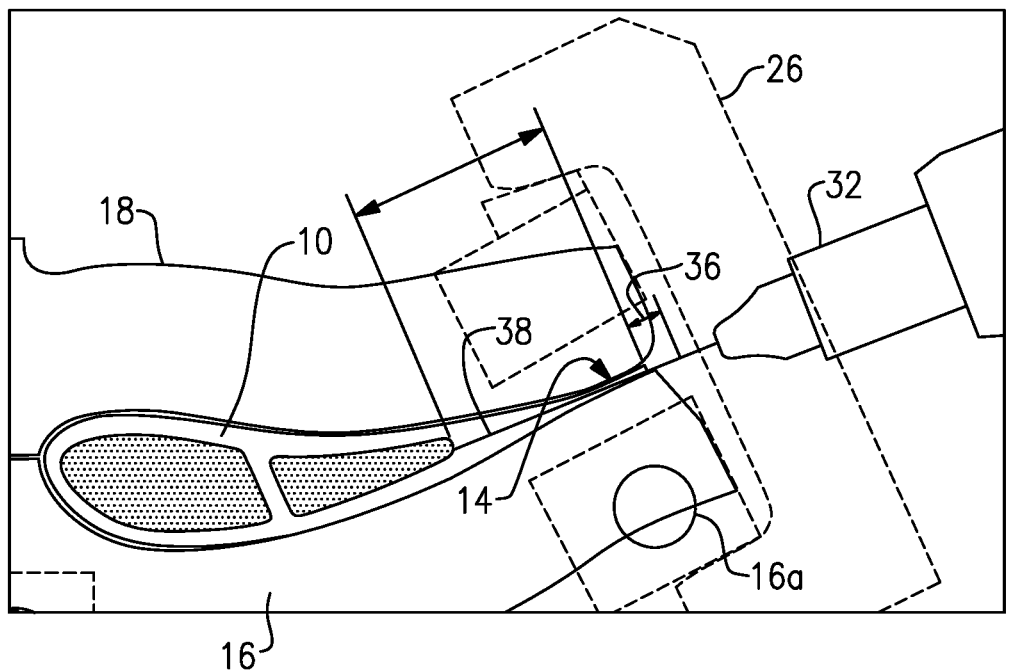
FIG. 7 illustrates the drilling operation, with a mandrel in the preform.

As shown in FIG. 7, the drill head 32 is set at a stand-off distance 36 from the edge of the tail portion 14. In the drilling operation, the electronic control module controls the drilling process, which may be conducted according to a computerized 3-dimensional model of the hole that is to be drilled. The hole 38 is then drilled through the tail portion 14 and trailing edge 10b until reaching the mandrel in the partially densified fiber preform 110. The mandrel thus serves to prevent back-strike during the drilling operation. Additional cooling holes may be drilled in a similar manner by re-positioning the drill head 32 relative to the fixture 12.

Figure 8:
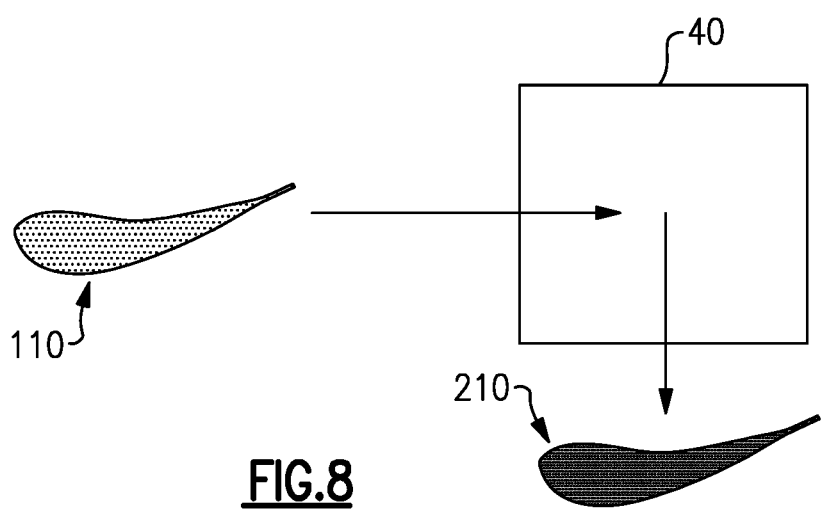
FIG. 8 illustrates the insertion of the partially densified fiber preform, after hole drilling, into a reactor for densification with a matrix material.

Referring to FIG. 8, after the drilling, the partially densified fiber preform 110 is removed from the drilling machine 30, removed from the fixture 12, and then inserted into a reactor 40 for deposition of the matrix material. Upon full densification (e.g., 15% void volume or less), the resulting fully densified CMC airfoil 210 is removed from the reactor 40. If necessary, one or more post-processing finishing processes may be conducted to complete the CMC airfoil 210. The deposition process may include, but is not limited to, a vapor deposition technique, such as chemical vapor infiltration. The matrix material may be, but is not limited to, a silicon-containing ceramic, such as a silicon carbide (SiC) or silicon nitride (Si3N4). For instance, the CMC airfoil 210 is a SiC/SiC ceramic matrix composite in which SiC fiber fabric is disposed within a SiC matrix.

The presence of the holes 38 in the partially densified fiber preform 110 during subsequent densification also serves to provide passages for gas to infiltrate the partially densified fiber preform 110, resulting in higher densification. This is especially desirable at the internal surfaces of the cooling holes 38, as higher densification facilitates increased thermal conductivity, lower permeability (to hold pressure), and smoother surfaces (for lower pressure drop). Additionally, in comparison to drilling holes after full densification, the process described herein may facilitate achieving tolerances of approximately 3× smaller. Tolerance improvements may include those due to angular variation of the cooling hole, which may depend on the size of the airfoil, hole length, and distance from the point of rotation about the hinge 22. With improved positioning, the length of the trailing edge can be increased, which may increase aerodynamic efficiency.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A fixture for forming a CMC airfoil, comprising:
   first and second tool segments that define an airfoil cavity there between for receiving an airfoil fiber preform, the cavity having a cavity leading edge, a cavity trailing edge, and first and second cavity sides joining the cavity leading edge and the cavity trailing edge, the first and second tool segments being couplable at a hinge at a forward end of the fixture, and
   the first tool segment including first and second datum features configured to position the fixture in a drilling machine for drilling one or more cooling holes.

2. The fixture as recited in claim 1, wherein the second tool segment includes a ridge in the cavity trailing edge.

3. The fixture as recited in claim 2, wherein the ridge is an elongated elevated band that extends in the cavity such that when the fixture is closed around the airfoil fiber preform the ridge contacts a tail portion of the airfoil fiber preform.

4. The fixture as recited in claim 2, wherein the ridge has a height of 0.001 inches to 0.005 inches.

5. The fixture as recited in claim 1, further comprising a clamp located at the cavity trailing edge on the aft end of the fixture and holding the first and second segments together.

6. The fixture as recited in claim 5, wherein the clamp is a carbon/carbon composite or a ceramic matrix composite.

7. The fixture as recited in claim 1, wherein the first datum feature includes a pin.

8. The fixture as recited in claim 1, wherein the first and second tool segments are graphite.

* * * * *